US006963506B1

(12) United States Patent
Wang et al.

(10) Patent No.: US 6,963,506 B1
(45) Date of Patent: Nov. 8, 2005

(54) CIRCUIT AND TECHNIQUE FOR ACCURATELY SENSING LOW VOLTAGE FLASH MEMORY DEVICES

(75) Inventors: Zhigang Wang, Santa Clara, CA (US); Nian Yang, Mountain View, CA (US); Yue-Song He, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 222 days.

(21) Appl. No.: 10/679,179

(22) Filed: Oct. 3, 2003

(51) Int. Cl.[7] .............................................. G11C 16/06
(52) U.S. Cl. ...................... 365/185.21; 365/185.03; 365/185.05; 365/185.18; 365/189.09; 365/207
(58) Field of Search ...................... 365/185.21, 185.03, 365/185.05, 185.18, 189.09, 207

(56) References Cited

U.S. PATENT DOCUMENTS

| | | | | |
|---|---|---|---|---|
| 5,119,330 A | * | 6/1992 | Tanagawa .............. | 365/185.03 |
| 5,262,984 A | * | 11/1993 | Noguchi et al. ....... | 365/185.03 |
| 5,841,698 A | * | 11/1998 | Hirano et al. .......... | 365/185.21 |
| 5,986,929 A | * | 11/1999 | Sugiura et al. ........ | 365/185.03 |
| 6,643,179 B2 | * | 11/2003 | Campardo et al. ..... | 365/185.21 |

* cited by examiner

*Primary Examiner*—Hoai Ho
*Assistant Examiner*—Ly Duy Pham
(74) *Attorney, Agent, or Firm*—Farjami & Farjami LLP

(57) ABSTRACT

An exemplary sensing circuit for sensing the current drawn by a target memory cell comprises a first transistor connected across a first node and a second node, a load connected across the second node and a third node, and a voltage boosting circuit coupled to a supply voltage, wherein the voltage boosting circuit supplies a voltage at the third node which is greater than the supply voltage.

20 Claims, 4 Drawing Sheets

CIRCUIT AND TECHNIQUE FOR ACCURATELY SENSING LOW VOLTAGE FLASH MEMORY DEVICES

TECHNICAL FIELD

The present invention relates generally to the field of semiconductor devices. More particularly, the present invention relates to semiconductor memory devices.

BACKGROUND ART

Memory devices are known in the art for storing data in a wide variety of electronic devices and applications. A typical memory device comprises a number of memory cells. Often, memory cells are arranged in an array format, where a row of memory cells corresponds to a word line and a column of memory cells corresponds to a bit line, and where each memory cell defines a binary bit, i.e., either a zero ("0") bit or a one ("1") bit.

Typically, the state of a memory cell is determined during a read operation by sensing the current drawn by the memory cell. According to one particular embodiment, the current drawn by a particular memory cell is ascertained by connecting the drain terminal of the memory cell to a sensing circuit, where the source terminal of the memory cell is connected to ground, and the gate of the memory cell is selected. The sensing circuit attempts to detect the current drawn by the memory cell, and compares the sensed memory cell current against a reference current. If the sensed memory cell current exceeds the reference current, the memory cell is considered an erased cell (e.g., corresponding to a "1" bit). However, if the sensed memory cell current is below the reference current, the memory cell is considered a programmed cell (e.g., corresponding to a "0" bit).

In one type of high density memory device, each memory cell is capable of storing four different charge levels, wherein the current drawn by the memory cell corresponds to the charge level stored by the memory cell. In this way, each memory cell is capable of storing two binary bits, where, for example, a first charge level corresponds to "00," a second charge level corresponds to "01," a third charge level corresponds to "10" and a fourth charge level corresponds to "11." In practice, it is desirable to have the sensed memory cell current be greater than or less than the reference current by a sufficient margin (also referred to as the "sense margin" in the present application) so as to accurately identify the charge level stored by the memory cell. However, when high density memory devices are implemented with a low supply voltage ("VCC"), such as 1.8 volts, for example, the sense margin is significantly reduced. When the read margin is significantly reduced, the reliability of sensing the memory cell current also decreases. The reliability and accuracy of the read operation are thus reduced, resulting in poor performance of the memory device. Accordingly, there exists a strong need in the art to overcome deficiencies of known sensing circuits and to provide a sensing circuit and technique for accurately sensing low voltage flash memory devices.

SUMMARY

The present invention addresses and resolves the need in the art for a sensing circuit and technique for accurately sensing low voltage flash memory devices. The invention also resolves the need in the art for a sensing circuit which improves the sense margin for low voltage flash memory devices during read memory operations.

According to one exemplary embodiment, a sensing circuit for sensing the current drawn by a target memory cell comprises a first transistor connected across a first node and a second node, a load connected across the second node and a third node, and a voltage boosting circuit coupled to a supply voltage. For example, the voltage boosting circuit can be a charge pump driven by a two-phase clock. The voltage boosting circuit supplies a voltage at the third node which is greater than the supply voltage. The target memory cell has a drain capable of being connected to the first node through a selection circuit during a read operation involving the target memory cell. During the read operation, the target memory cell draws a target memory cell current when activated, and a sense amp input voltage is generated at the second node. Due to the particular arrangement of the sensing circuit, the sense margin for sensing target memory cell current is significantly increased, and the accuracy of the memory device is significantly improved.

According to one embodiment, the target memory cell is capable of storing four charge levels. In this particular embodiment, the four charge levels comprise a first charge level drawing approximately 0 microamperes during the read operation, a second charge level drawing approximately 10 microamperes during the read operation, a third charge level drawing approximately 15 microamperes during the read operation, and a fourth charge level drawing approximately 20 microamperes during the read operation.

Other features and advantages of the present invention will become more readily apparent to those of ordinary skill in the art after reviewing the following detailed description and accompanying drawings.

DETAILED DESCRIPTION OF THE INVENTION

The present invention is directed to a sensing circuit and technique for accurately sensing low voltage flash memory devices. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
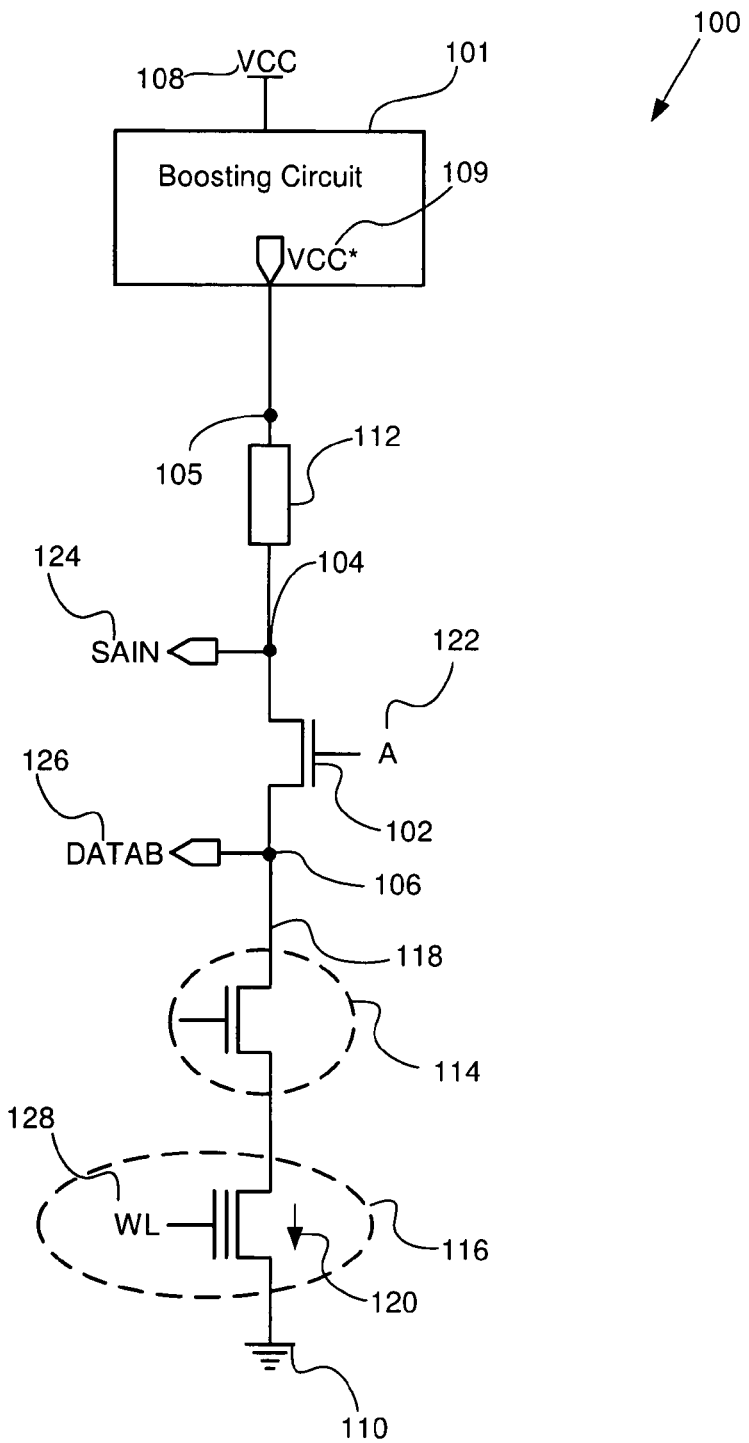
FIG. 1 depicts a circuit diagram of an exemplary sensing circuit in accordance with one embodiment of the present invention.

Referring first to FIG. 1, there is shown a circuit diagram of exemplary sensing circuit 100 according to one embodiment of the present invention. Sensing circuit 100 can be part of a larger circuit arrangement (not shown) which itself may be part of a memory device. For example, sensing circuit 100 may be used for multi-level charge ("MLC") flash memory devices. To illustrates the features of the invention, reference will be made to exemplary memory cells capable of storing four different charge levels, wherein the current drawn by the memory cell corresponds to the charge level stored by the memory cell, where, for example, a first charge level corresponds to "00," a second charge level corresponds to "01," a third charge level corresponds to "10" and a fourth charge level corresponds to "11." In one particular embodiment, the first charge level draws approximately 0 microamperes ($\mu$A), the second charge level draws approximately 10 $\mu$A, the third charge level draws approximately 15 $\mu$A, and the fourth charge level draws 20 approximately $\mu$A. As discussed below, due to the particular arrangement of sensing circuit 100, sensing circuit 100 achieves accurate memory cell sensing for low voltage flash memory device.

As shown in FIG. 1, sensing circuit 100 includes voltage boosting circuit 101, load 112, and transistor 102. Transistor 102 is connected across nodes 104 and 106, and load 112 is connected across nodes 104 and 105. Load 112 can, for example, be a p-channel FET (PFET) or any other circuit element or arrangement capable of supplying an impedance or resistive load across nodes 104 and 105. Transistor 102 has a drain connected to node 104 and a source connected at node 106 to target memory cell 116 through selection circuit 114. As shown in FIG. 1, selection circuit 114 connects node 106 to the drain of target memory cell 116 via line 118 during a read operation involving target memory cell 116. The source of target memory cell 116 is coupled to ground 110.

Figure 2:
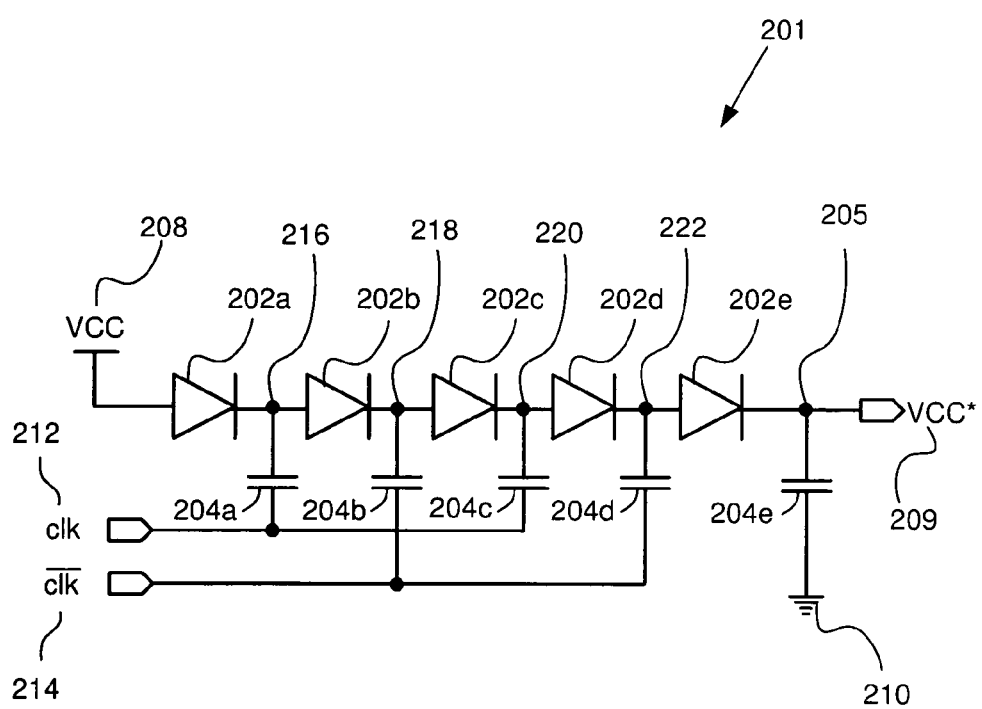
FIG. 2 depicts a circuit diagram of an exemplary voltage boosting circuit which can be used in one embodiment of the present invention.

Also shown in FIG. 1, voltage boosting circuit 101 receives supply voltage ("VCC") 108 and supplies VCC* 109 at node 105. VCC 108 may, for example, be a low voltage, such as 1.8 volts (V). Voltage boosting circuit 101 supplies VCC* 109 at node 105 such that VCC* 109 is greater than VCC 108. With reference to FIG. 2, exemplary voltage boosting circuit 201 which can be used in one embodiment of the present invention is shown, wherein VCC* 209 and node 205 respectively corresponds to VCC* 109 and node 105 in FIG. 1. In FIG. 2, voltage boosting circuit 201 comprises diodes 202a, 202b, 202c, 202d and 202e connected in series, and capacitors 204a, 204b, 204c, 204d and 204e. VCC 208 is supplied to the anode of diode 202a, one phase of a two-phase clock ("clk") 212 is supplied to a first end of each capacitor 204a and 204c, and the other phase of the two-phase clock ("$\overline{\text{clk}}$") 214 is supplied to a first end of each capacitor 204b and 204d. A second end of capacitor 204a is connected at node 216, a second end of capacitor 204b is connected at node 218, a second end of capacitor 204c is connected at node 220, and a second end of capacitor 204d is connected at node 222. Capacitor 204e is connected across node 205 and ground 210. As shown in FIG. 2, VCC* 209 is generated at the cathode of diode 202e at node 205. In FIG. 2, voltage boosting circuit 201 operates as a charge pump and diodes 202a, 202b, 202c, 202d and 202e and capacitors 204a, 204b, 204c, 204d and 204e operate as charge relay elements, clock-driven by inputs clk 212 and $\overline{\text{clk}}$ 214 and VCC 208 to supply VCC* 209. In one embodiment, voltage boosting circuit 201 receives VCC 208 of approximately 1.8V and generates VCC* 209 of approximately 3.3V.

With continuing reference to FIG. 1, during a read operation involving target memory cell 116, voltage A 122 is supplied to the gate of transistor 102, selection circuit 114 connects node 106 to the drain of target memory cell 116, and wordline (WL) 128 is supplied to the gate of target memory cell 116 activating target memory cell 116, which draws target memory cell current 120 along line 118. In FIG. 1, voltage A 122 is supplied to the gate of transistor 102 during this operation, such that voltage level DATAB 126 generated at node 106 is generally fixed, and sense amp input voltage ("SAIN") 124 generated at node 104 corresponds to target memory cell current 120 drawn by target memory cell 116. Although element 102 in FIG. 1 is shown as transistor 102, transistor 102 can be replaced by other circuit arrangements, such as a cascode amplifier in other embodiments.

Figure 3:
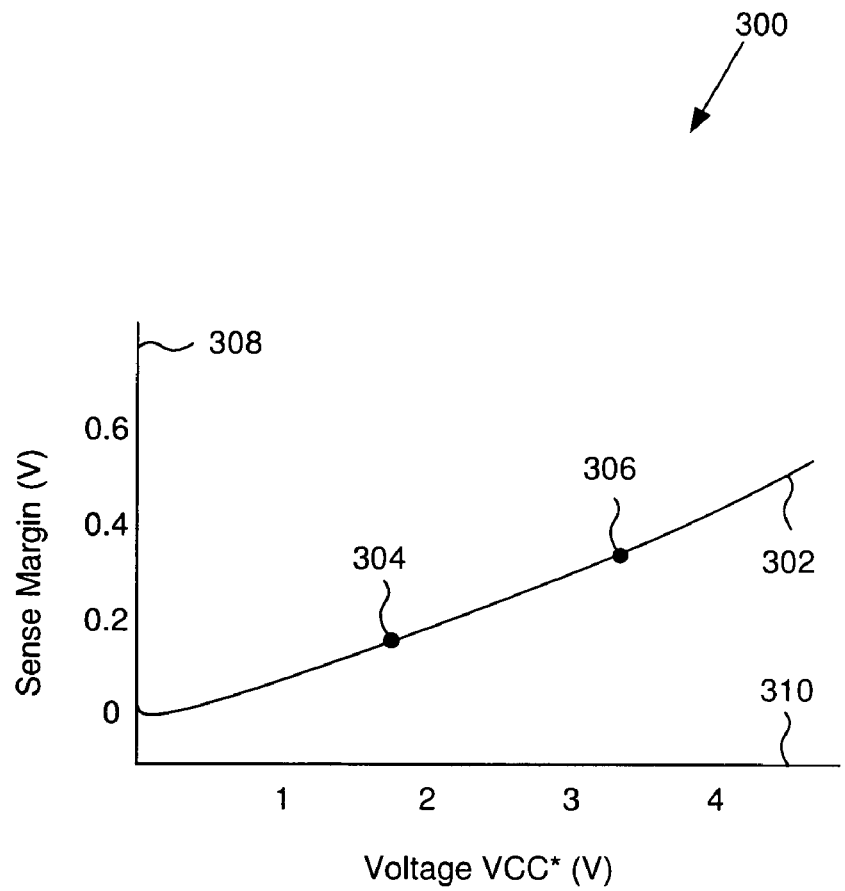
FIG. 3 depicts a graph illustrating the sense margin characteristics of a sensing circuit in relation to various voltages.

Due to the particular arrangement of sensing circuit 100 in FIG. 1, the sense margin for detecting the state of target memory cell 116 is greatly improved. More particularly, since VCC* 109 supplies a higher voltage than VCC at node 105, the voltage range of SAIN 124 generated by sensing circuit 100 is significantly increased. For example, SAIN 124 is defined by a range between DATAB 126 and VCC* 109. With reference to FIG. 3, graphs 300 depicts curve 302 corresponding to sense margin characteristics of a sensing circuit in relation to various voltages at node 105. Vertical axis 308 of graph 300 defines the voltage level of the sense margin of a sensing circuit, while horizontal axis 310 defines the voltage VCC*, e.g., corresponding to the voltage at node 105 in FIG. 1. As shown in FIG. 3, exemplary point 304 of curve 302 corresponding to a low voltage at node 105, e.g., approximately equal to a low voltage VCC of 1.8V, results in a very a low sense margin of approximately 1.8V. In contrast, exemplary point 306 of curve 302 corresponding to VCC* 109 of approximately 3.3V at node 105 as generated by voltage boosting circuit 101, corresponds to a significantly increased sense margin of approximately 0.4 V. This increased voltage margin results in improved accuracy for target memory cell sensing during read operations, particularly for low VCC 108 applications.

To more clearly illustrate the advantages of the present invention, an examination of the sensing margin achieved according to sensing circuit 100 is provided. In FIG. 1, SAIN 124 (also referred to as "SAIN") is given by:

$$SAIN = VCC^* - Icore \cdot RL \qquad \text{(Equation 1)}$$

where Icore is target memory cell current 120, RL represents the resistance (or impedance) of load 112, and "VCC*" is VCC* 109 generated at node 105 by voltage boosting circuit 101. Similarly, the sense amp reference voltage ("SAREF") corresponding to a reference current ("Iref") drawn by a reference memory cell (e.g., where the reference memory cell replaces target memory cell 116 and SAREF replaces SAIN 124 in FIG. 1) is given by:

$$SAREF = VCC^* - Iref \cdot RL \qquad \text{(Equation 2).}$$

With Equations 1 and 2, the voltage margin ($\Delta v$) for sensing circuit 100 is given by:

$$\Delta v = |SAIN - SAREF| \quad \text{(Equation 3)}$$
$$= (VCC^* - Icore \cdot RL) - (VCC^* - Iref \cdot RL)$$
$$= RL(Icore - Iref)$$
$$= RL \cdot \Delta i$$

where $\Delta i$ is equal to (Icore−Iref) and corresponds to the current margin. For erased target memory cell 116, SAIN 124 is equal to or very close to DATAB 126 (also referred to as "DATAB"), and thus substituting DATAB for SAIN in Equation 1 and solving for RL yields:

$$RL = (VCC^* - DATAB)/IER \quad \text{(Equation 4)}$$

where IER is erased target memory cell current 120 drawn by erased target memory cell 116. Substituting Equation 4 into Equation 3 yields:

$$\Delta v = (VCC^* - DATAB) \cdot (\Delta i / IER) \quad \text{(Equation 5)}.$$

Figure 4:
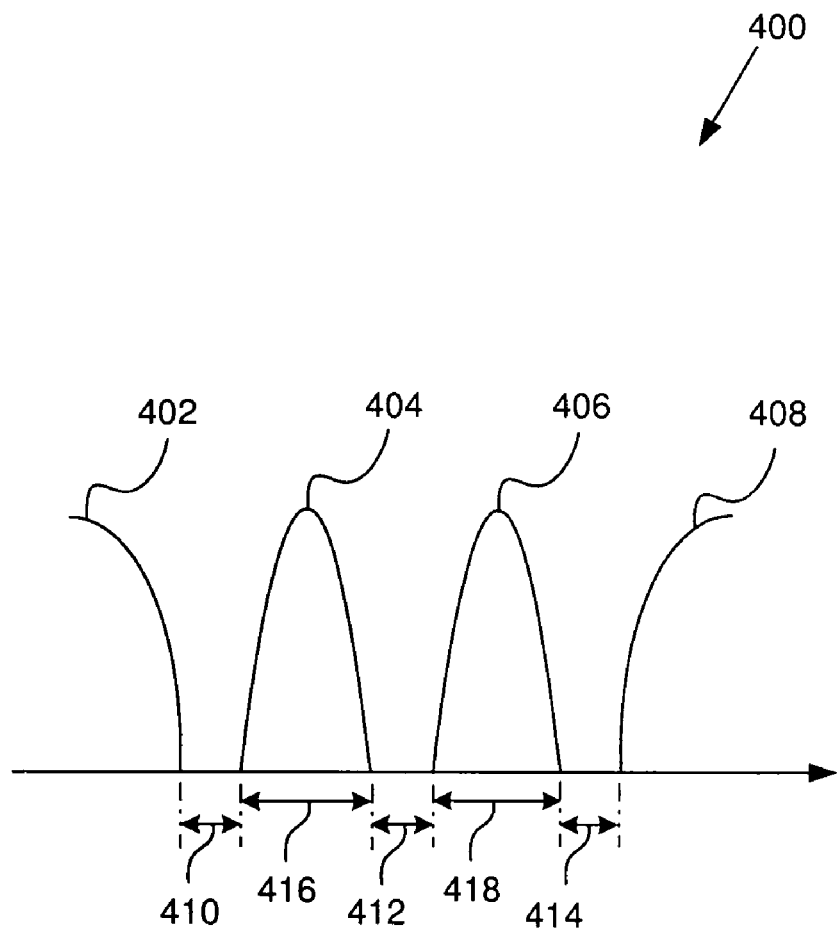
FIG. 4 depicts a graph showing distribution curves corresponding to a multi-level charge memory device.

With reference now to FIG. 4, graph 400 shows distribution curves 408, 406, 404 and 402 corresponding respectively to charge levels one, two, three and four, discussed above, where the horizontal axis corresponds to the current drawn by target memory cell 116 or target memory cell 216. As shown in FIG. 4, current window 410 corresponds to the current window between distribution curves 402 and 404, current window 412 corresponds to the current window between distribution curves 404 and 406, and current window 414 corresponds to the current window between distribution curves 406 and 408. Also shown in FIG. 4, current distribution width 418 corresponds to charge level two, and current distribution width 416 corresponds to charge level three. With continuing reference to FIG. 1, the maximum value for current margin ($\Delta i(\max)$) is given by:

$$\Delta i < \Delta i(\max) = (\Delta iw)/2 \quad \text{(Equation 6)}$$

where $\Delta iw$ is equal to the minimum of ($\Delta i1$, $\Delta i2$ and $\Delta i3$) and where $\Delta i1$, $\Delta i2$ and $\Delta i3$ respectively correspond to current window 410, current window 412 and current window 414 in FIG. 4. Substituting Equation 6 into Equation 5 yields:

$$\Delta v = (VCC^* - DATAB) \cdot (\Delta iw/2IER) \quad \text{(Equation 7)}.$$

With continuing reference to FIG. 4, erased cell current IER is given by:

$$IER = \Delta iw1 + \Delta C2 + \Delta iw2 + \Delta C3 + \Delta iw3 \quad \text{(Equation 8)}$$

where $\Delta C2$ is current distribution width 416, and $\Delta C3$ is current distribution width 418. If the values of $\Delta iw1$, $\Delta iw2$ and $\Delta iw3$ are equal, Equation 8 can be re-written as:

$$IER = 3\Delta iw + \Delta C2 + \Delta C3 \quad \text{(Equation 9)}.$$

Solving for $\Delta iw$ in Equation 9 yields:

$$\Delta iw = \{IER - (\Delta C2 + \Delta C3)\}/3 \quad \text{(Equation 9')}.$$

Thus:

$$(\Delta iw/IER) = \{IER - (\Delta C2 + \Delta C3)\}/(3IER) \quad \text{(Equation 10)}$$
$$= \{1 - (\Delta C2 + \Delta C3)/IER\}/3.$$

Substituting Equation 10 into Equation 7 yields voltage margin for sensing circuit 100:

$$\Delta v = (VCC^* - DATAB) \cdot \{1 - (\Delta C2 + \Delta C3)/IER\}/6 \quad \text{(Equation 11)}.$$

From Equation 11, the voltage margin ($\Delta v$) for sensing circuit 100 is significantly increased over the voltage margin for convention sensing circuits since the voltage at node 105 corresponding to VCC* is increased over VCC by voltage boosting circuit 101. As such, the particular arrangement of sensing circuit 100 significantly improves the voltage margin and results in improved accuracy for target memory cell sensing during read operations, particularly for low VCC 108 applications. In sum, sensing circuit 100 provides an effective means for enhancing and improving the sensing margin for flash memory devices, thereby improving memory device performance and accuracy.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, specific circuit elements and circuit arrangement of voltage boosting circuit 201 referred to in FIG. 2 can be modified without departing from the scope of the present invention; voltage boosting circuit 201 can be, by way of example, a charge pump driven by a four-phase clock instead of the two-phase clock discussed in the present application. Furthermore, the types of transistors, loads, and the particular voltages or voltage ranges referred to in the present application can be modified without departing from the scope of the present invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a sensing circuit and technique for accurately sensing low voltage flash memory devices have been described.

What is claimed is:

1. A sensing circuit for a target memory cell, said sensing circuit comprising:
    said target memory cell having a drain capable of being connected to a first node through a selection circuit during a read operation involving said target memory cell, said target memory cell drawing a target memory cell current when activated during said read operation;
    a first transistor being connected across said first node and a second node;
    a load being connected across said second node and a third node; and
    a voltage boosting circuit being coupled to a supply voltage, said voltage boosting circuit supplying a voltage at said third node which is greater than said supply voltage.

2. The sensing circuit of claim 1 wherein a sense amp input voltage is generated at said second node during said read operation.

3. The sensing circuit of claim 1 wherein said target memory cell is capable of storing four charge levels.

4. The sensing circuit of claim 3 wherein said four charge levels comprises a first charge level drawing approximately 0 microamperes during said read operation, a second charge level drawing approximately 10 microamperes during said read operation, a third charge level drawing approximately 15 microamperes during said read operation, and a fourth charge level drawing approximately 20 microamperes during said read operation.

5. The sensing circuit of claim 1 wherein said voltage boosting circuit comprises a charge pump driven by a two-phase clock.

6. The sensing circuit of claim 1 wherein a source of said target memory cell is coupled to a reference voltage, and a gate of said target memory cell is connected to a word line, said word line activating said target memory cell during said read operation.

7. The sensing circuit of claim 6, wherein said reference voltage is ground.

8. A multi-level charge memory device comprising:
   a target memory cell having a drain capable of being connected to a first node through a selection circuit during a read operation involving said target memory cell, said target memory cell drawing a target memory cell current when activated during said read operation; and
   a sensing circuit comprising a first transistor, a load, and a voltage boosting circuit, said first transistor being connected across said first node and a second node, said load being connected across said second node and a third node, said voltage boosting circuit being coupled to a supply voltage, said voltage boosting circuit supplying a voltage at said third node which is greater than said supply voltage.

9. The multi-level charge memory device of claim 8 wherein a sense amp input voltage is generated at said second node during said read operation.

10. The multi-level charge memory device of claim 8 wherein said target memory cell is capable of storing four charge levels.

11. The multi-level charge memory device of claim 10 wherein said four charge levels comprises a first charge level drawing approximately 0 microamperes during said read operation, a second charge level drawing approximately 10 microamperes during said read operation, a third charge level drawing approximately 15 microamperes during said read operation, and a fourth charge level drawing approximately 20 microamperes during said read operation.

12. The multi-level charge memory device of claim 8 wherein said voltage boosting circuit comprises a charge pump driven by a two-phase clock.

13. The multi-level charge memory device of claim 8 wherein a source of said target memory cell is coupled to a reference voltage, and a gate of said target memory cell is connected to a word line, said word line activating said target memory cell during said read operation.

14. The multi-level charge memory device of claim 13, wherein said reference voltage is ground.

15. A sensing circuit for a target memory cell, said target memory cell having a drain capable of being connected to a first node through a selection circuit during a read operation involving said target memory cell, said target memory cell drawing a target memory cell current when activated during said read operation, a first transistor being connected across said first node and a second node, said sensing circuit being characterized by:
   a load being connected across said second node and a third node, a voltage boosting circuit being coupled to a supply voltage, said voltage boosting circuit supplying a voltage at said third node which is greater than said supply voltage.

16. The sensing circuit of claim 15 wherein a sense amp input voltage is generated at said second node during said read operation.

17. The sensing circuit of claim 15 wherein said target memory cell is capable of storing four charge levels.

18. The sensing circuit of claim 17 wherein said four charge levels comprises a first charge level drawing 0 approximately microamperes during said read operation, a second charge level drawing approximately 10 microamperes during said read operation, a third charge level drawing approximately 15 microamperes during said read operation, and a fourth charge level drawing approximately 20 microamperes during said read operation.

19. The sensing circuit of claim 15 wherein said voltage boosting circuit comprises a charge pump driven by a two-phase clock.

20. The sensing circuit of claim 15 wherein a source of said target memory cell is coupled to a reference voltage, and a gate of said target memory cell is connected to a word line, said word line activating said target memory cell during said read operation.

* * * * *